(12) United States Patent
Kim

(10) Patent No.: US 8,164,143 B2
(45) Date of Patent: Apr. 24, 2012

(54) SEMICONDUCTOR DEVICE

(75) Inventor: Joong Sik Kim, Goyang-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 13/091,860

(22) Filed: Apr. 21, 2011

(65) Prior Publication Data
US 2011/0210394 A1    Sep. 1, 2011

Related U.S. Application Data

(62) Division of application No. 12/326,285, filed on Dec. 2, 2008, now Pat. No. 7,951,655.

(30) Foreign Application Priority Data

May 28, 2008 (KR) .................. 10-2008-0049892

(51) Int. Cl.
  *H01L 27/01* (2006.01)
  *H01L 27/12* (2006.01)
  *H01L 31/0392* (2006.01)
(52) U.S. Cl. .............. 257/347; 257/E29.3; 438/151

(58) Field of Classification Search ............... 257/347, 257/E21.049, E29.3; 438/151, 197, 795
See application file for complete search history.

(56) References Cited

U.S. PATENT DOCUMENTS

| | | | | |
|---|---|---|---|---|
| 5,804,858 | A * | 9/1998 | Hsu et al. ............ | 257/347 |
| 5,874,328 | A * | 2/1999 | Liu et al. ............ | 438/199 |
| 6,001,698 | A | 12/1999 | Kuroda | |
| 6,228,719 | B1 | 5/2001 | Frisina et al. | |
| 6,432,787 | B1 | 8/2002 | Mandelman et al. | |
| 7,332,420 | B2 | 2/2008 | Moriwaki | |
| 7,405,124 | B2 * | 7/2008 | Chang ............ | 438/259 |
| 7,700,426 | B2 * | 4/2010 | Kim et al. ............ | 438/201 |
| 2008/0230838 | A1 * | 9/2008 | Ohara ............ | 257/350 |
| 2009/0230472 | A1 * | 9/2009 | Chung ............ | 257/347 |

FOREIGN PATENT DOCUMENTS
KR    10-0551942    6/2005
* cited by examiner

*Primary Examiner* — Phuc Dang
(74) *Attorney, Agent, or Firm* — Marshall, Gerstein & Borun LLP (57) ABSTRACT

A method for fabricating a semiconductor device comprises: performing a thermal process to expanding a local doped region formed between gate patterns on a semiconductor substrate; and etching a central region of an expanded local doped region so that the expanded local doped region remains at the total area of sidewalls of floating bodies isolated from each other.

4 Claims, 7 Drawing Sheets

SEMICONDUCTOR DEVICE

CROSS-REFERENCE TO RELATED APPLICATION

This is a division of U.S. application Ser. No. 12/326,285 filed Dec. 2, 2008, now U.S. Pat. No. 7,951,655, which claims the priority benefit under USC 119 of KR 10-2008-0049892 filed May 28, 2008, the entire respective disclosures of which are incorporated herein by reference.

BACKGROUND OF THE INVENTION

The invention relates generally to a method for fabricating a semiconductor device and, more specifically, to a technology of forming a floating body transistor used in a highly-integrated semiconductor device using a silicon-on-insulator (SOI) structure.

In many semiconductor device systems, a semiconductor memory apparatus is configured to store data generated or processed in the device. For example, if a request from a data processor such as a central processing unit (CPU) is received, a semiconductor memory apparatus may output data to the data processor from unit cells in the apparatus, or the apparatus may store data processed by the data processor to unit cells of an address transmitted with the request.

As data storage capacities of semiconductor memory apparatus have increased, the sizes of semiconductor memory apparatus have not increased proportionally. Thus, various elements and components used for read or write operations in a semiconductor memory apparatus have also reduced in size. Accordingly, components and elements unnecessarily duplicated in the semiconductor memory apparatus, such as transistors or wires, are combined or merged to decrease the area occupied by each component. Particularly, the reduction of the size of unit cells included in the semiconductor memory apparatus affects improvement of the degree of integration.

As an example of a semiconductor memory apparatus, Dynamic Random Access Memory (DRAM) is a type of volatile memory device configured to retain data while a power source is supplied. The unit cell comprises a transistor and a capacitor. In the case of the unit cell having a capacitor, after the datum "1" is delivered to the capacitor, charges that are temporarily stored in the storage node are dissipated, i.e., the amount of the charge stored therein is reduced, because of both leakage currents generated at junction of the storage nodes and inherent characteristics of the capacitor. As a result, a refresh operation is periodically required on the unit cells so that data stored in the DRAM cannot be destroyed.

In order to prevent the reduction of charge, numerous methods for increasing capacitance (Cs) of the capacitor included in the unit cell have been suggested so that more charges may be stored in the storage node. For example, an insulating film used earlier in the capacitor, e.g., an oxide film, may be replaced with an advanced insulating film which has a larger dielectric constant, such as a nitrified oxide film or a high dielectric film. Otherwise, a capacitor having a two-dimensional structure is changed to have a three-dimensional cylindrical structure or a trench structure, thereby increasing the surface area of both electrodes of the capacitor.

As the design rule is reduced, the plane area where a capacitor can be formed is reduced, and it is difficult to develop materials constituting an insulating film in the capacitor. As a result, the junction resistance value of the storage node (SN) and the turn-on resistance value of the transistor in the unit cell are larger, and accordingly it is difficult to perform normal read and write operations, and refresh characteristics deteriorate.

To improve the above-described shortcomings, the unit cell may comprise a transistor having a floating body. Thus, the unit cell of the semiconductor memory apparatus does not include a capacitor used for storing data, but stores data in a floating body of the transistor included in the unit cell.

In order to store data in the floating body, a voltage level supplied on the word line is reduced by ½ or ⅓ of voltage level applied to the bit line connected to one active region of the transistor, thereby generating hot carriers. When the datum "1" is delivered, a large amount of hot carriers are generated in a junction region of the bit lines (BL). Then, electrons are sent out into the bit line (BL) but holes remain in the floating body (FB). Otherwise, when the datum "0" is transmitted, the hot carriers are not generated in the junction region, so that any holes do not remain in the floating body (FB). The holes kept in the floating body lower the threshold voltage of the transistor of the unit cell; as a result, the amount of current flowing through the transistor increases. That is, the amount of current flowing when the holes are stored in the floating body of the transistor is larger than that flowing when no holes are stored. As a result, it is possible to distinguish whether the datum "1" or "0" is stored in the unit cell.

The semiconductor memory apparatus that comprises the floating body transistor does not include a capacitor, thereby improving the ability to maximize the degree of integration. However, it is difficult to prevent reduction of the amount of holes that the floating body of the FB transistor stores, due to a leakage current that occurs at junctions between the floating body and either a source line or a bit line. Generally, active regions of the transistor, which are connected to the bit line or the source line, include impurities of high concentration in order to reduce resistance resulting from junction with metal layers. However, if the active region (e.g. source or drain region) of the transistor is doped with impurities of high concentration, the amount of leakage current between the active region and the floating body may increase. As a result, the amount of holes stored in the floating body is dissipated as time goes by. Also, since the amount of leakage current increases in proportion to temperature, data stored in the transistor of the unit cell are easily deleted under conditions of high temperature.

FIGS. 1a to 1e are cross-sectional diagrams illustrating a prior art method for manufacturing a floating body transistor in a semiconductor memory apparatus.

Figure 1A:
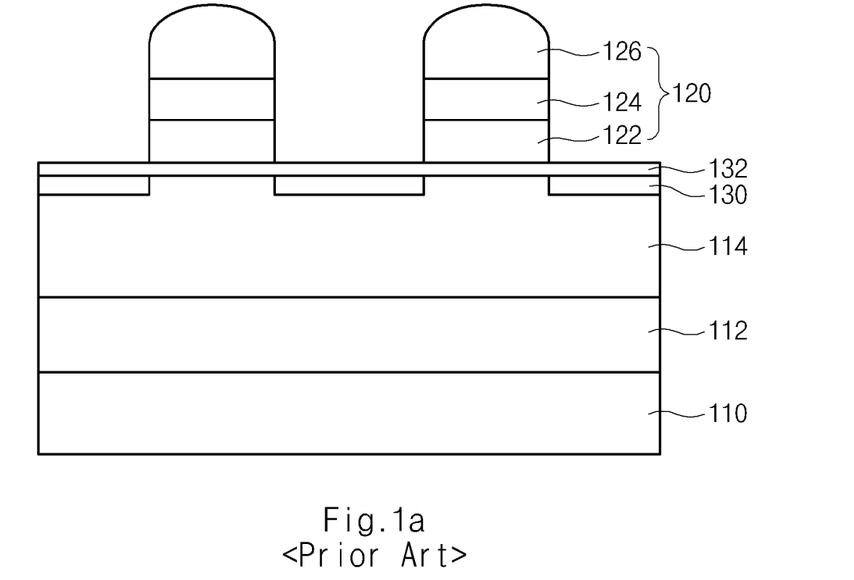
FIGS. 1a to 1e are cross-sectional diagrams illustrating a prior art method for manufacturing a floating body transistor in a general semiconductor memory apparatus.

Referring to FIG. 1a, a gate oxide film 132 is formed over an upper silicon layer 114 of a silicon-on-insulator (SOI) semiconductor substrate. A gate pattern 120 that comprises a gate electrode including a polysilicon layer 122, a metal layer 124, and a hard mask 116 for protecting the gate electrode is formed. The SOI substrate comprises a lower silicon layer 110, a lower insulating oxide layer 112 formed on the lower silicon layer 110, and an upper silicon layer 114 formed on a lower insulating oxide layer 112. The SOI wafer thus includes an insulating layer 112 that is artificially formed between the upper silicon layer 114, which is the top surface, and the lower silicon layer 110, which is a basic layer, so as to remove the impact from the basic layer, thereby improving the process, efficiency, and characteristics of a high-pure silicon layer formed over the insulating layer. Since the SOI wafer provides a zero-defective thin silicon layer isolated with an insulating layer (thermal oxide film), an insulating wall or a well-forming process is not required, so that the product developing time, producing time, and cost are reduced. Also, there is no burden on equipment investment because the equipment that uses a general wafer reduces unnecessary equipment.

After the gate pattern is formed, an ion implantation process is performed (see the arrows in FIG. 1b) on the upper silicon layer 114 located at both sides of the gate pattern 120, thereby obtaining a source/drain region 130. In order to prevent a hot carrier effect (HCE), the source/drain region 130 is neither deeply formed nor expanded to a lower portion of the gate pattern while the doping concentration is lowered by the ion implantation process.

Referring again to FIG. 1b, a local halo region 140 is formed at a deeper location than the source/drain region 130 in the upper silicon layer 114 through the ion implantation process. The local halo region 140 formed in the body of the transistor is a high concentration doped region that prevents a punch-through phenomenon between the source and the drain. The local halo region 140 prevents the ion-implanted region from diffusing into a space between the source/drain regions by thermal treatment when a plug is formed in a subsequent process.

Figure 1B:
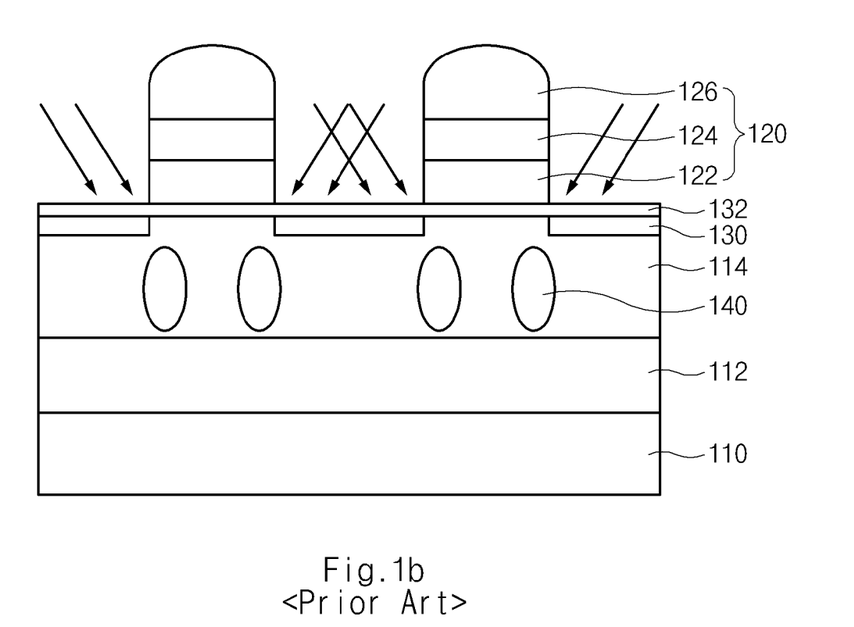
Figure 1C:
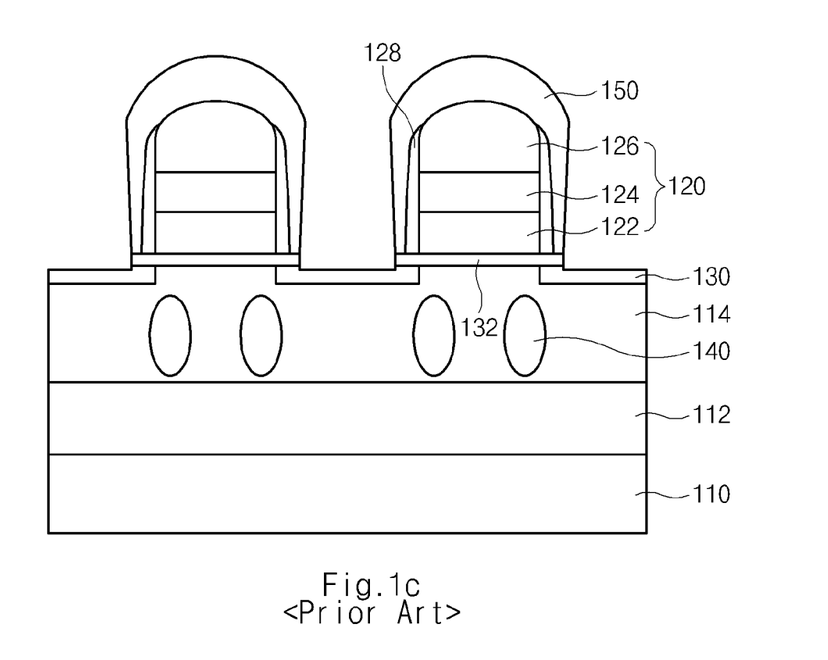

Referring to FIG. 1c, a spacer 128 is formed at sidewalls of the gate pattern 120, and an oxide film 150 that protects the gate pattern is formed over the sidewalls and the gate pattern. The oxide film, which has been widely used to protect the gate pattern, is formed over the structure including the gate pattern, and a self-aligned etching process is performed on the oxide film to obtain a cap-type oxide film 150 that protects the top surface of the gate pattern. An etch-back process is performed to etch the gate oxide film 132 and the oxide film 150, thereby exposing the source/drain region 130.

Figure 1D:
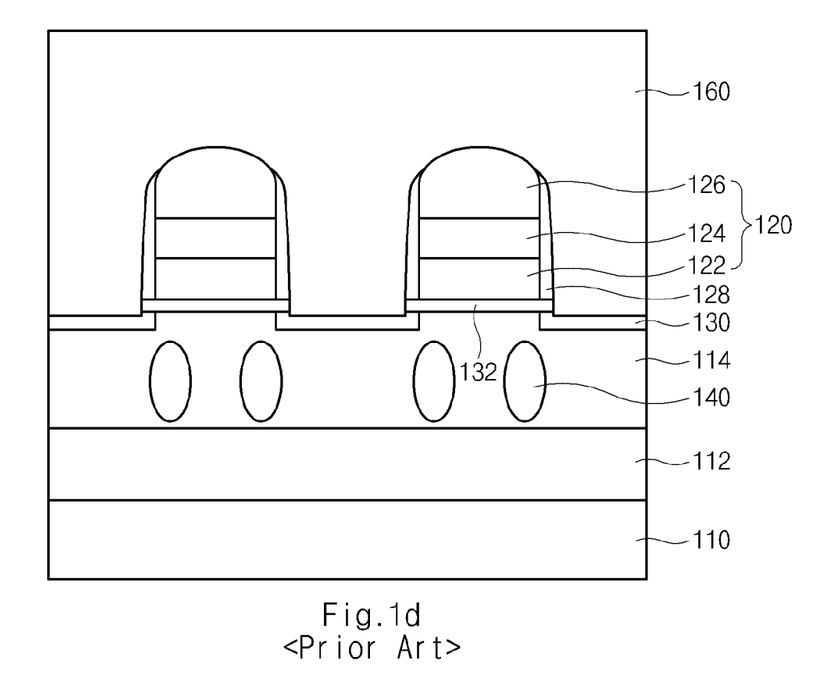

Referring to FIG. 1d, a doped polysilicon layer 160 that forms a plug is formed over the structure including the gate pattern 120. The polysilicon layer 160 contacts the gate pattern 120 and the source/drain region 130.

Figure 1E:
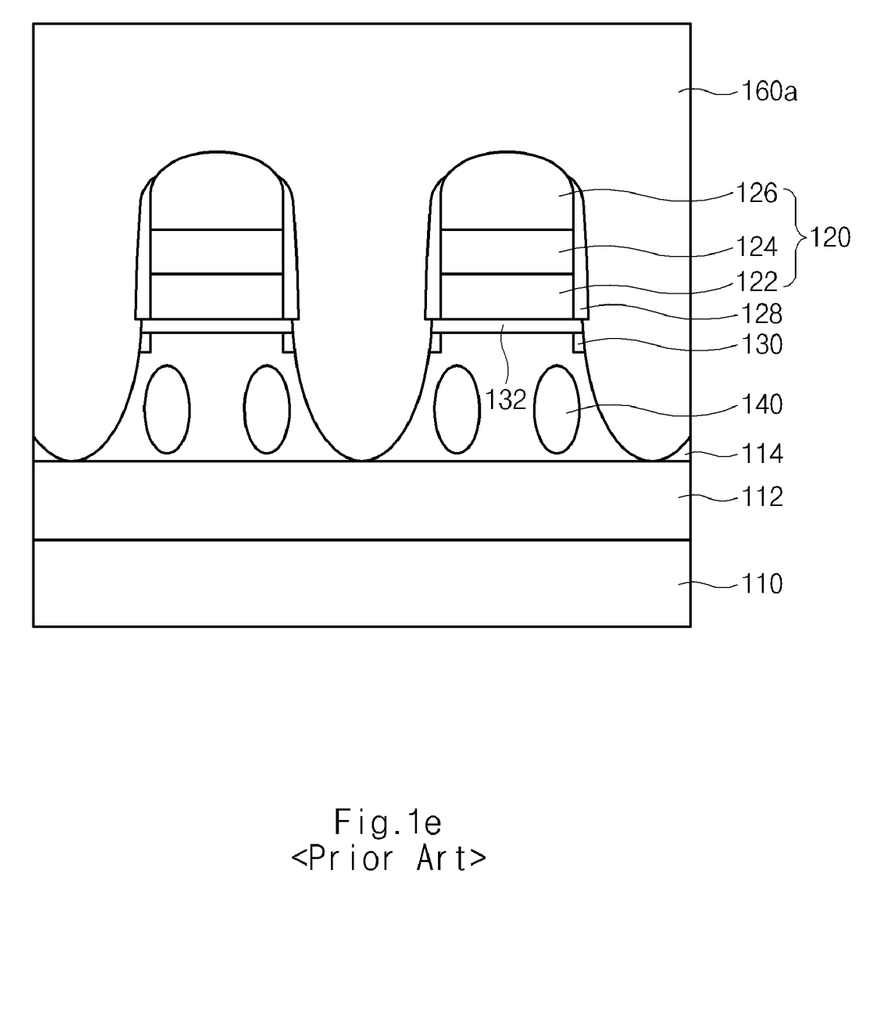

Referring to FIG. 1e, the doped polysilicon layer 160 is diffused into the upper silicon layer 114 by thermal treatment, so that transistors corresponding to each gate pattern 120 are separated, and a source and a drain of each transistor is defined. The diffused polysilicon layer 160a is diffused into the lower insulating oxide layer 112, so that a body of the neighboring transistor is completely isolated.

In the floating body transistor fabricated over the SOI wafer, it is advantageous to isolate cells in a single active region rather than to isolate unit cells through a device isolation film by shallow trench isolation (STI) process in order to maximize the cell packing density. However, when the entire size of the transistor is reduced, the distance between source/drain regions of the transistor having a plane channel region is reduced to cause a punch-through phenomenon, which is difficult to prevent this.

Referring again to FIG. 1e, when the diffusion process is performed at a high temperature after the polysilicon film 160 of high concentration is deposited, the polysilicon film 160 is diffused horizontally as well as vertically, thereby obtaining the diffused polysilicon layer 160a that serves as a plug. Due to the horizontal diffusion, the effective volume of the body of each transistor is reduced (that is, the effective channel length becomes shorter). Also, the punch-through phenomenon may occur in the top or bottom portion of the floating body formed in the upper silicon layer 114.

Specifically, the punch-through phenomenon frequently occurs in the bottom portion of the floating body having a lower concentration than in the top portion of the floating body having a higher concentration by channel doping when the gate pattern 120 is formed. In order to prevent the punch-through phenomenon, an ion tilt implantation process is performed to form the local halo region 140 in the upper silicon layer 114. As the distance between the neighboring gate patterns becomes shorter due to reduction of the design rule, the tilt angle is not sufficiently secured in the ion tilt implantation process, so that it is difficult to form the local halo region 140 in the bottom portion of the floating body. When the local halo region 140 is not formed in the bottom portion of the floating body, it is difficult to prevent the punch-through phenomenon in the floating body of the transistor, thereby degrading the reliability of the device.

BRIEF SUMMARY OF THE INVENTION

Various embodiments of the invention are directed to providing a semiconductor device and a method for fabricating the same. In the method, a local doped region instead of a halo doped region is formed at total area of sidewalls of a floating body so that a short-channel effect such as the punch-through phenomenon is prevented.

In one embodiment of the invention, a method for fabricating a semiconductor device comprises: expanding a local doped region formed between gate patterns by a thermal process to form an expanded local doped region; and, etching a central region of the expanded local doped region so that the expanded local doped region entirely covers sidewalls of floating bodies formed beneath the gate patterns to isolate the floating bodies from each other.

Preferably, the thermal process is performed until the local doped region is expanded in a vertical direction to a buried insulating layer in and horizontally to a predetermined region under a spacer for protecting sidewalls of the gate patterns.

Preferably, the semiconductor substrate is a silicon-on-insulator substrate and the method further comprises: performing an ion implantation process on the silicon-on-insulator substrate exposed between the gate patterns to form the local doped region; and, forming a spacer at sidewalls of the gate patterns.

Preferably, the ion implantation process is performed at a tilt angle of zero degrees.

Preferably, the method further comprises: forming a gate oxide layer on the silicon-on-insulator substrate; and forming the gate patterns on the gate oxide layer.

Preferably, the method further comprises: depositing a conductive material in an etched central region of the expanded local doped region to form a plug between the gate patterns.

Preferably, the method further comprises performing another thermal process after depositing the conductive material.

Preferably, the lower region of the floating body including the expanded local doped region is wider than an upper region thereof.

Preferably, the method further comprises forming oxide layers to protect the gate patterns.

Preferably, etching a central region of an expanded local doped region is carried out by an etch-back process to remove an exposed area of both a gate oxide layer and the expanded local doped region between the oxide layers.

Preferably, the etch-back process is performed until a buried insulating layer included in a silicon-on-insulator substrate is exposed.

In another embodiment of the invention, a semiconductor device comprises gate patterns, and floating bodies having sidewalls formed under each of the gate patterns, wherein a local doped region is formed to entirely cover the sidewalls of each floating body to isolate the floating bodies from each other.

Preferably, the gate patterns are formed on a silicon-on-insulator substrate and the floating bodies are formed in an upper silicon layer on a buried insulating layer included in the silicon-on-insulator substrate.

Preferably, the local doped region is connected both to the buried insulating layer in a vertical direction and to a predetermined region under a spacer to protect sidewalls of the gate patterns in a horizontal direction.

Preferably, the semiconductor device further comprises a gate oxide layer formed between the gate patterns and the upper silicon layer.

Preferably, the local doped region formed at a lower region of the floating body is wider than an upper region thereof.

DESCRIPTION OF EMBODIMENTS

FIGS. 2a to 2g are cross-sectional diagrams illustrating a method for manufacturing a floating body transistor for use in a semiconductor memory apparatus according to one embodiment of the invention.

Figure 2A:
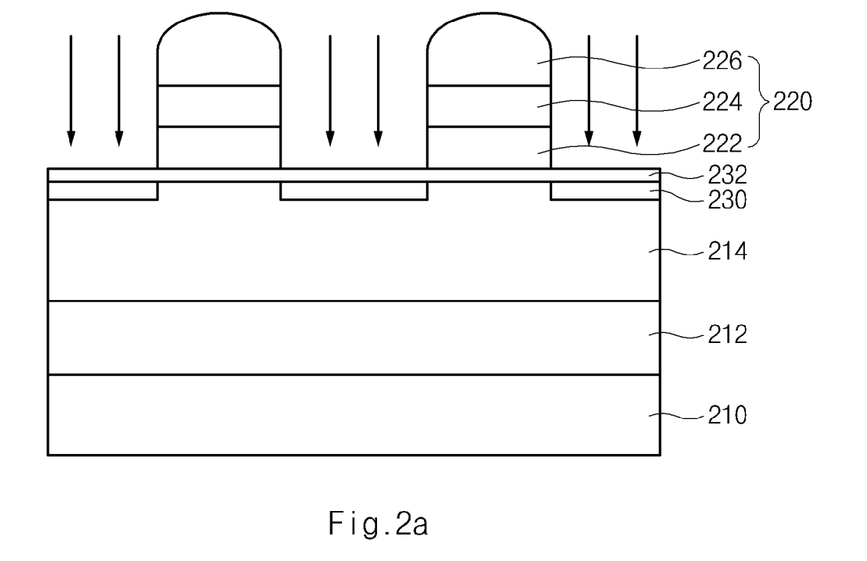
FIGS. 2a to 2g are cross-sectional diagrams illustrating a method for manufacturing a floating body transistor in a semiconductor memory apparatus of an embodiment of the invention.

Referring to FIG. 2a, a gate oxide film 232 is formed over an upper silicon layer 214 of an SOI semiconductor substrate. A gate pattern 220 that includes a gate electrode comprising a polysilicon layer 222, a metal layer 224, and a hard mask 226 for protecting the gate electrode is formed. The SOI substrate comprises a lower silicon layer 210, a lower insulating oxide layer 212 formed on the lower silicon layer 210, and an upper silicon layer 214 formed on the lower insulating oxide layer 212. Impurities are doped between the gate patterns 220 to form a lightly doped drain (LDD) (not shown).

After the gate pattern 220 is formed, an ion implantation process is performed on the upper silicon layer 214 located at both sides of the gate pattern 220, thereby obtaining a source/drain region 230. In order to prevent a hot carrier effect (HCE), the source/drain region 230 is neither deeply formed nor expanded to a lower portion of the gate pattern while the doping concentration is decreased by the ion implantation process.

Figure 2B:
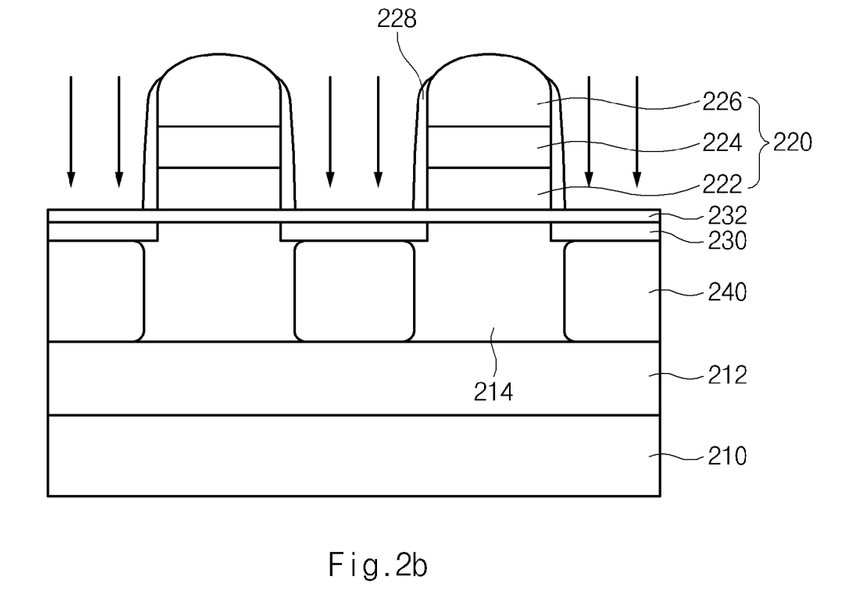

Referring to FIG. 2b, a spacer 228 is formed at sidewalls of the gate pattern 220. After the spacer 228 is formed, a local halo region 240 is formed in the bottom portion of the source/drain region 230 located at the upper silicon layer 214 through an ion implantation process. Unlike the conventional art, an ion-tilt implantation process is not performed; rather a vertical ion implantation process (i.e., a process wherein the tilt angle is zero degrees) is used to form the local halo region 240. As a result, it is easy to form the local halo region 240 in the bottom portion of the source/drain region 230 located between the neighboring gate patterns 220, even though the design rule is reduced.

Figure 2C:
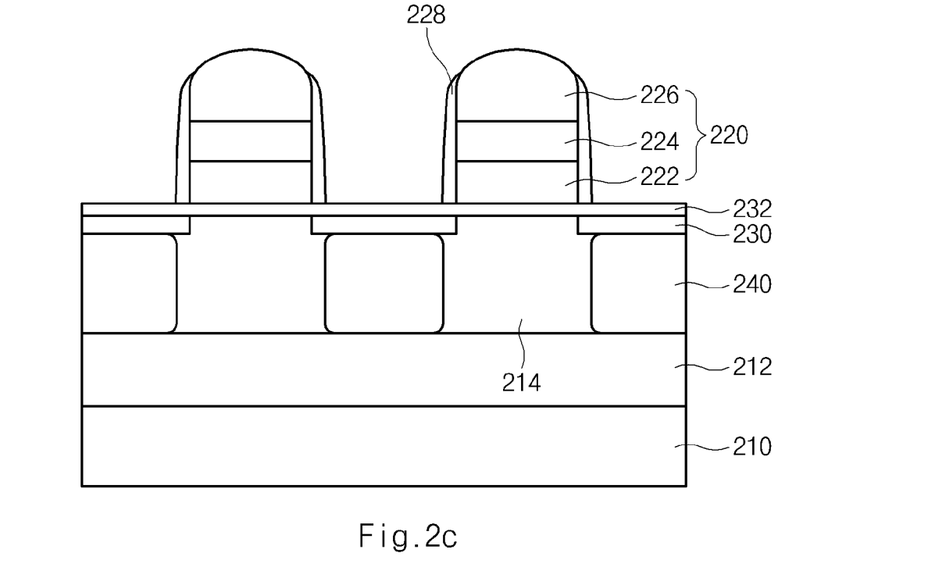

Referring to FIG. 2c, after the ion implantation process forms the local halo region 240, a thermal treatment process is performed. As a result, the local halo region 240 is diffused vertically and thus is expanded into the lower insulating oxide layer 212. The local halo region 240 is also diffused horizontally to penetrate into the lower region of the spacer 228 formed at sidewalls of the gate pattern 220.

Figure 2D:
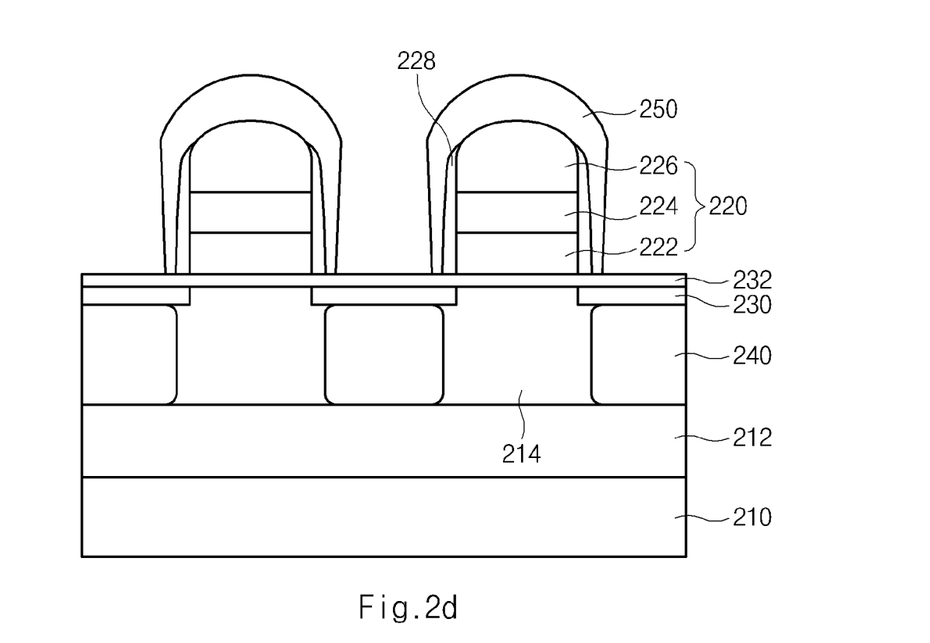

Referring to FIG. 2d, an oxide film 250 that protects the gate pattern is formed. The oxide film 250 is formed over the structure including the gate pattern, and a self-aligned etching process is performed, thereby forming a cap-type oxide film that protects the top surface of the gate pattern as shown in FIG. 2d.

Figure 2E:
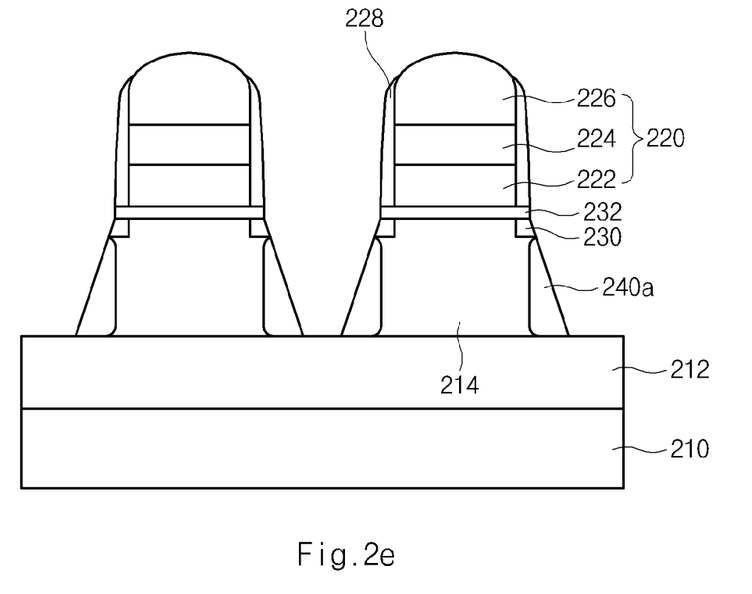

After the oxide film 250 is formed, an etch-back process is performed, as shown in FIG. 2e, to etch the upper silicon layer 214 and the gate oxide film 232 exposed between the gate pattern 220 and the oxide film 250 that protects the gate pattern, thereby exposing the lower insulating oxide layer 212. Since the local halo region 240 is formed in the upper silicon layer 214 between the gate patterns 220, a central region of the local halo region 240 is etched so that a peripheral region, which comes in contact with the body of the neighboring transistor, remains. The etched local halo region 240a remains in the bottom portion of the source/drain region 130 to prevent the punch-through phenomenon in the floating body.

Referring to FIG. 2e, the etched local halo region 240a is not vertically aligned with the gate pattern but etched slantwise. Thus, the silicon active region 214 and the local halo region 240a that remain in the lower region of the gate pattern 220 are formed in the shape of a trapezoid. Therefore, the upper portion is narrower than the lower portion in the silicon active region 214, which may occur when a material deposited between narrow patterns is etched. It is not necessary to perform a vertical etching process with an enhanced etch condition, but it is sufficient to expose the lower insulating oxide layer 212 and isolate the neighboring silicon active regions 214 that remain in the lower region of each gate pattern 220. Particularly, as the sidewall tilt of the etched local halo region 240a is gradual, the volume of the floating body of the transistor is larger, and it is easier to prevent the punch-through phenomenon in the bottom of the floating body having a lower doping concentration.

Figure 2F:
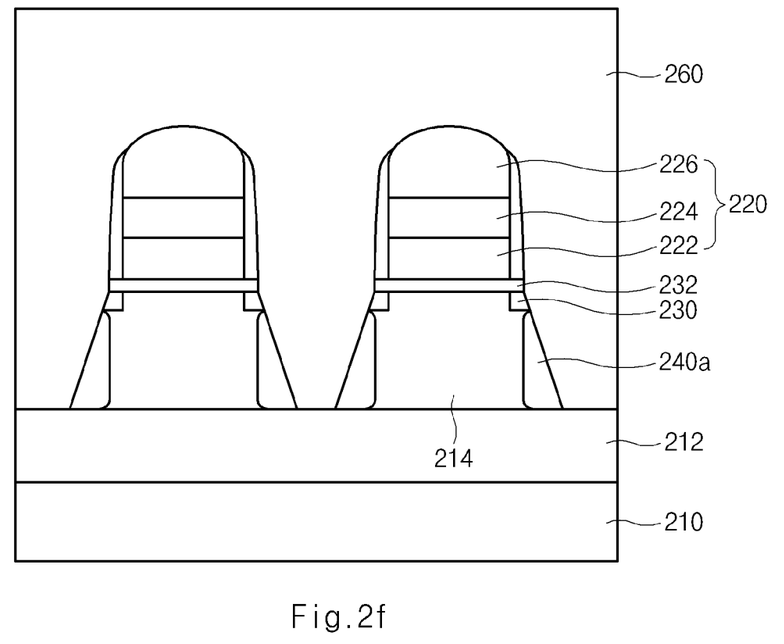
Figure 2G:
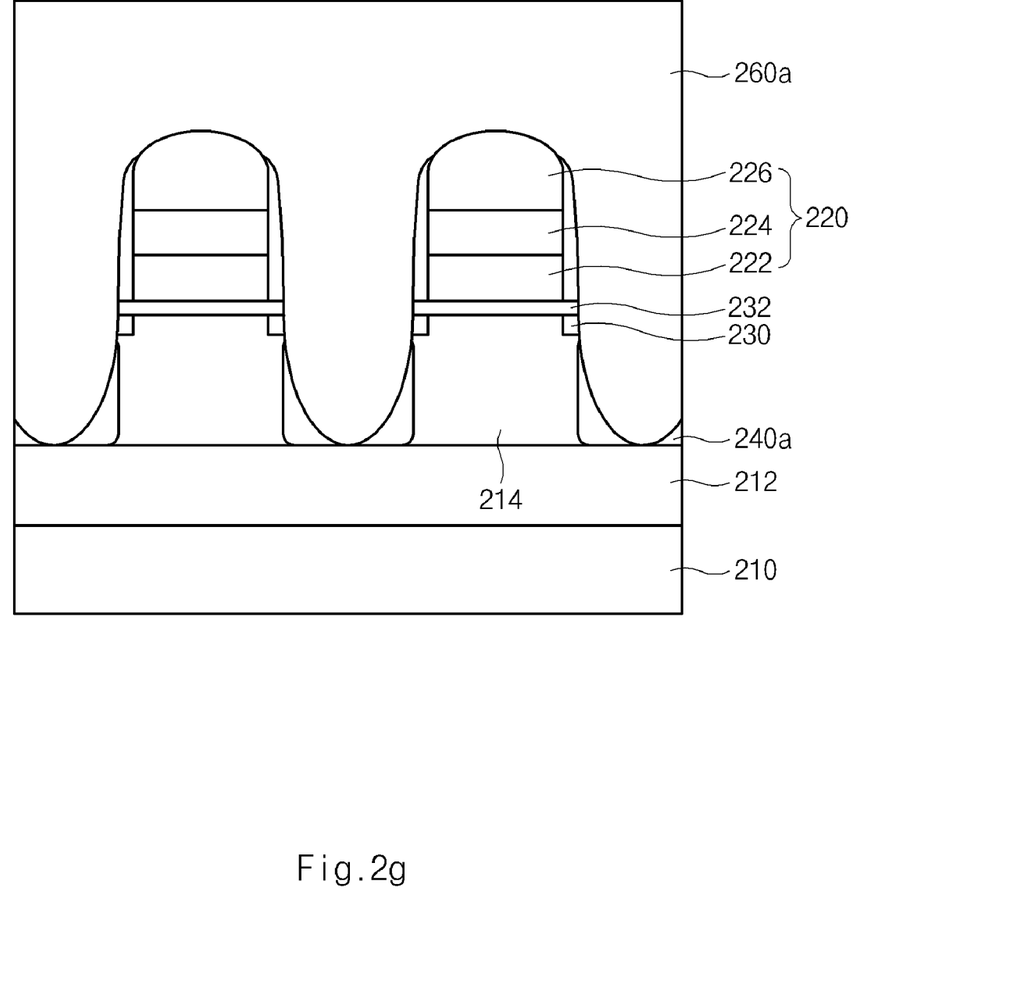

Referring to FIG. 2f, a polysilicon material 260, which is conductive, is deposited over the gate pattern 220 and the region etched between the gate patterns. When a thermal treatment process is performed after the polysilicon 260 is deposited, as shown in FIG. 2g, the polysilicon 260 of the plug region is diffused, thereby forming diffused polysilicon 260a. Although the upper portion of the etched local halo region 240a becomes thinner than the lower portion thereof, the upper portion of the floating body 214a has a higher doping concentration than the lower portion of the floating body 214a, thereby preventing the punch-through phenomenon.

In the conventional art, referring to FIG. 1b, the ion tilt implantation process is performed to form the local halo region 140 over the upper silicon layer 114. Due to reduction of the design rule, the interval between the neighboring gate patterns 120 is narrow, so that a tilt angle is not readily secured in the ion tilt implantation process. As a result, it is difficult to form the local halo region 140. However, in the embodiment of the invention, the local halo region 240 is etched slantwise to form a plug, so that the volume of the floating body becomes larger, thereby preventing the punch-through phenomenon that may occur in the bottom of the floating body.

As described above, in a floating body transistor fabricated in a SOI substrate of one embodiment of the invention, it is easy to isolate each transistor and to form a local halo region that prevents a punch-through phenomenon at both sides of the floating body, thereby improving the integration and stability of the semiconductor device. Particularly, when the floating body transistor is used as a cell transistor in a semiconductor memory apparatus, the integration of the semiconductor memory apparatus can be greatly improved.

The foregoing embodiments of the invention are illustrative and not limiting. Various alternatives and equivalents are possible. The invention is not limited by the type of deposition, etching polishing, and patterning steps describe herein, nor is the invention limited to any specific type of semiconductor device. For example, the invention may be implemented in a dynamic random access memory (DRAM) device or non-volatile memory device. Other additions, subtractions, or modifications are intended to fall within the scope of the appended claims.

What is claimed is:

1. A semiconductor device comprising gate patterns and floating bodies, each floating body being formed under each of the gate patterns and having sidewalls, wherein a local doped region is formed to entirely cover sidewalls of each floating body to isolate the floating bodies from each other, wherein a local doped region formed at a lower region of a floating body is wider than an upper region thereof.

2. The semiconductor device of claim 1, wherein the gate patterns are formed on a silicon-on-insulator substrate and the floating bodies are formed in an upper silicon layer on a buried insulating layer included in the silicon-on-insulator substrate.

3. The semiconductor device of claim 2, wherein the local doped region is connected to both the buried insulating layer in a vertical direction and to a predetermined region under a spacer for protecting sidewalls of the gate patterns in a horizontal direction.

4. The semiconductor device of claim 1, further comprising a gate oxide layer formed between the gate patterns and the upper silicon layer.

* * * * *